United States Patent [19]
Taylor

[11] Patent Number: 5,612,649
[45] Date of Patent: Mar. 18, 1997

[54] INVERTER AMPLIFIER CIRCUITS

[75] Inventor: Clive R. Taylor, Welwyn Garden City, England

[73] Assignee: VLSI Technology, Inc., San Jose, Calif.

[21] Appl. No.: 643,755

[22] Filed: May 6, 1996

[51] Int. Cl.$^6$ .............................. H03B 5/36; H03B 5/04; H03F 1/30; H03F 3/16

[52] U.S. Cl. .................... 331/116 FE; 331/158; 331/176; 330/277; 330/288; 330/290

[58] Field of Search .................. 331/116 R, 116 FE, 331/117 R, 117 FE, 117 D, 158, 175, 176, DIG. 3; 330/277, 288, 290, 299

[56] References Cited

U.S. PATENT DOCUMENTS 5,552,751   9/1996   Cooper ............................. 331/116 FE

FOREIGN PATENT DOCUMENTS 0315877   8/1991   European Pat. Off. .

*Primary Examiner*—Davis Mis
*Attorney, Agent, or Firm*—Burns, Doane, Swecker & Mathis, LLP

[57] ABSTRACT

An inverter is connected between the control nodes of two transistors in a current mirror system which forms a closed current feedback loop. Any difference between the bias voltages at the input and output of the inverter is reduced to zero. The self-biasing inverter amplifier may comprise the active part of an oscillator but may also be used as a level shifter or a reference circuit.

13 Claims, 5 Drawing Sheets

5,612,649

INVERTER AMPLIFIER CIRCUITS

FIELD OF THE INVENTION

This invention relates to inverter amplifier circuits, particularly but not exclusively circuits in which an inverter forms part of an oscillator.

BACKGROUND TO THE INVENTION

It is known to employ an inverting amplifier which is connected in a loop with a frequency selective element or branch, for example constituted by a quartz crystal, to constitute an oscillator. A resistor is connected between the input and output of the inverter to set the operating point of the oscillator. Such a circuit however is known to be disadvantageous, because the resistor, which may take the form of a transmission gate, typically has a poorly controlled resistance value. If there is no well controlled voltage bias for the transmission gate, the resistance presented by the transmission gate will vary significantly over the supply range. Poorly controlled feedback resistance leads to instability of the oscillator and can cause a long delay before the oscillator reaches a stable frequency of oscillation.

To alleviate these difficulties it has been proposed in EP-B-0315877 to provide a system of current mirrors that in essence provide weak inversion from the output back to the input of the main inverter. However, the circuit is still subject to process variations and requires the proper setting of the slope factor of a source follower. It also suffers from parasitic oscillations.

SUMMARY OF THE INVENTION

The present invention is based on a circuit which is constituted by a differential pair of current mirrors, preferably arranged so that the mirrors share two main current paths in which the diode-connected elements of the two mirrors are respectively connected. The inverter is connected between the control nodes of one of the current mirrors. This arrangement ensures that any voltage difference between the input and output of the inverter is inverted and multiplied by the loop gain so as to force the equality of the bias voltages at the input and output of the inverter.

One use for such a circuit is as a drive circuit for an oscillator but the circuit is also useful as a level shifting circuit for use with an oscillator, a reference circuit from which current-injected level shifting can be derived, or as a self-biasing inverting amplifier.

DETAILED DESCRIPTION

Figure 1:
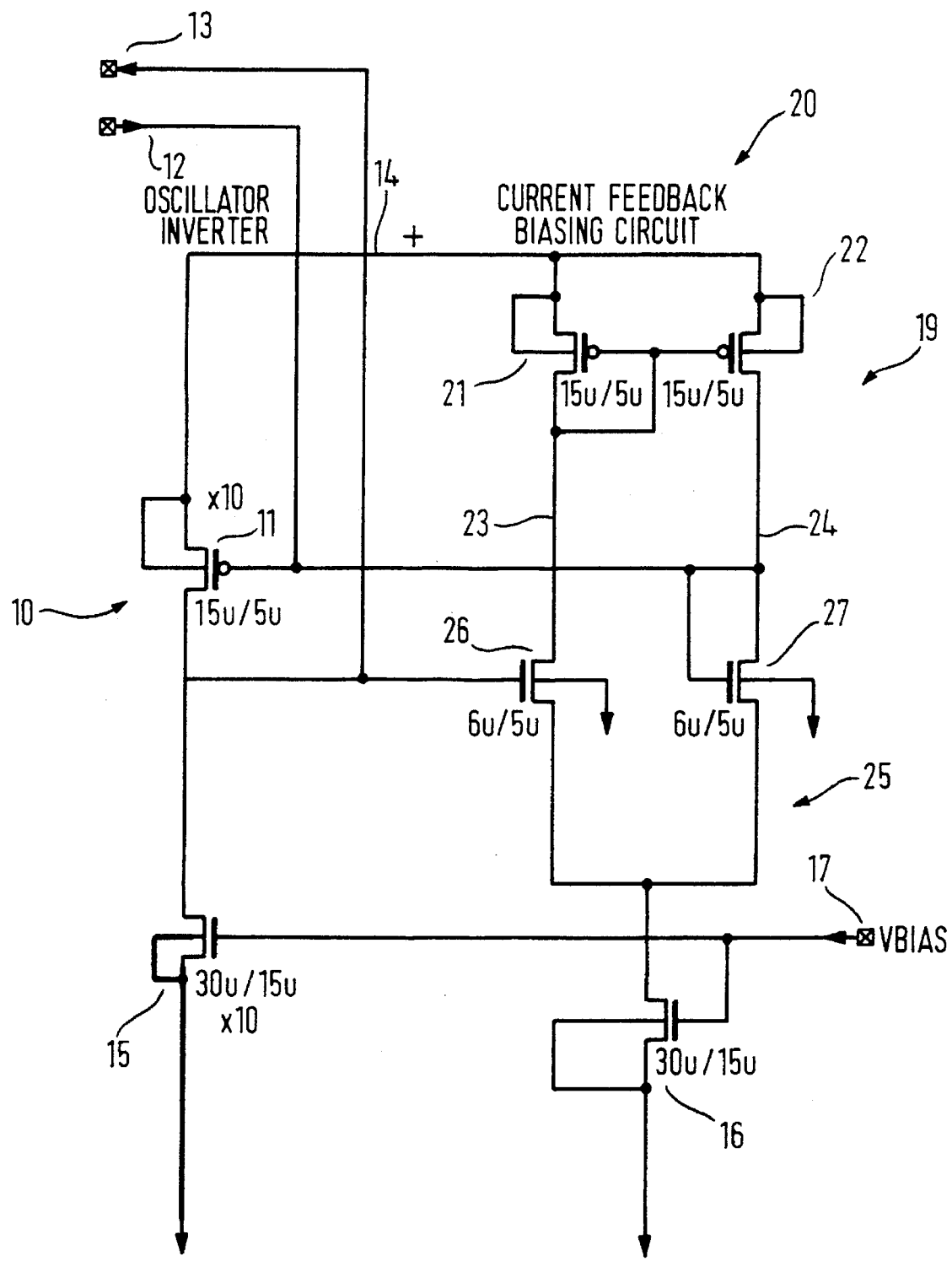
FIG. 1 illustrates one form of oscillator circuit according to the invention.

FIG. 1 illustrates one embodiment of an oscillator incorporating an inverter and an associated feedback circuit according to the invention.

An inverter element 10 in the circuit shown in FIG. 1 is constituted by a p-channel transistor 11 which may be, when implemented as part of an integrated circuit, disposed in an n-well within a p-channel substrate. One advantage of such a provision is a comparative immunity against noise arising from signals injected into the substrate.

The gate of transistor 11 is connected to an 'input' terminal 12 whereas the drain of transistor 11 is connected to an 'output' terminal 13. When the inverter forms part of an oscillator, a frequency selective circuit or branch, such as a quartz crystal, is connected between these terminals 12 and 13, so as to provide a circuit which resembles the oscillatory part of the circuit shown in FIG. 1 of EP-B-0315877. The source of the transistor 11 maybe connected to a positive supply rail 14. The drain of transistor 11 may be connected to an n-channel transistor 15 which constitutes part of a current mirror with an n-channel transistor 16, the gate of transistor 16 being connected to the drain thereof and also to an input bias terminal 17. The current mirror constituted by the two transistors 15 and 16 may typically provide ten times the current through the left transistor 15 as through the transistor 16. The transistor 16 sets the total current through a current mirror system 19 which constitutes a current feedback biasing circuit.

The current mirror system 19 comprises an upper current mirror 20 constituted by similar p-channel transistors 21 and 22. The source of each of these transistors is connected to the positive rail and their gates are connected together. Further, the gate of transistor 21 is connected to the drain thereof. The transistors 21 and 22 in this current mirror 20 are preferably matched so that the currents in the two main current paths 23 and 24 through these transistors are equal, typically of the order of 50 nA.

The current paths 23 and 24 are connected by way of a second current mirror 25 arranged differentially to the first. This second current mirror is constituted by transistors 26 and 27. The drains of these two transistors are connected to the drains of the P-channel transistors 21 and 22 and the sources of these two transistors 26 and 27 are connected in common to the drain of the transistor 16. The gate of transistor 27 is connected to the drain thereof.

If the gate of transistor 27 were connected to the gate of transistor 26 directly, the connection thereby made would complete a ordinary current mirror. In this invention, the gates of transistors 26 and 27 are connected by way of the inverter 10.

Any voltage difference between the two terminals of the inverter is inverted and multiplied by the resultant loop gain which forces the bias voltage at the input to equal the bias voltage at the output. Provided that the transistors of the differential current mirrors 20, 25 are properly matched, this equilibrium of bias voltages can be maintained over very wide ranges of supply voltages, such as for example from 1 volt to 5.5 volts, and over a very wide range of operating temperature, such as from −40° C. to 85° C.

Figure 2:
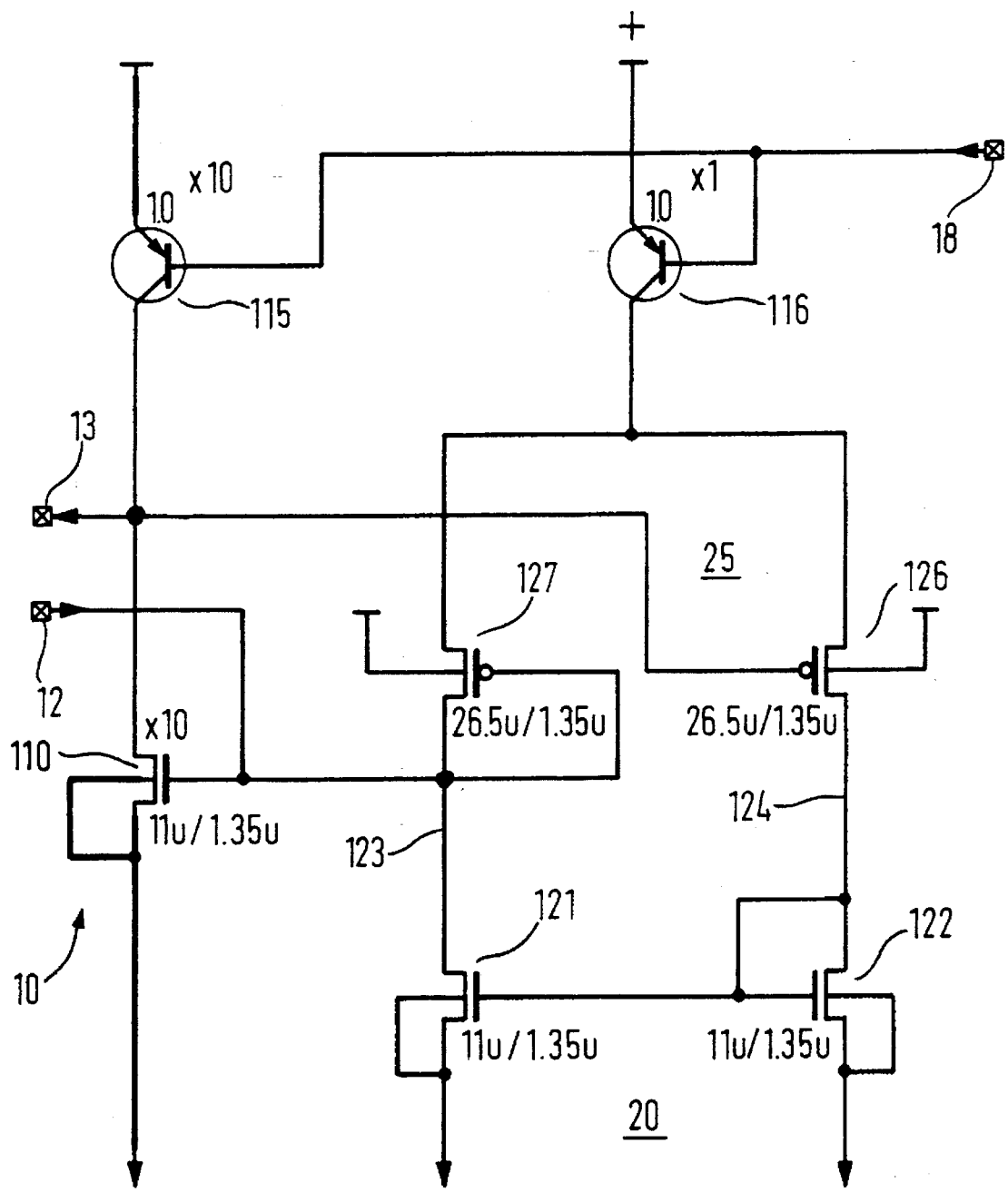
FIG. 2 illustrates a second embodiment of the invention.

Another embodiment of the invention is shown in FIG. 2. In this example, the inverter amplifier 10 is constituted by an n-channel transistor 110. A current source for this transistor is provided by a p-n-p transistor 115 which provides for the inverter 10 a multiple (such as ten times) of the total current through the current mirrors 20 and 25, which correspond in function to the mirrors 20 and 25 in FIG. 1. The current through the current mirrors is set by a p-n-p transistor 116 controlled like transistor 115 by the bias line 18. The current mirror 20 is constituted by transistors 121 and 122 so as to provide two mirror paths 123 and 124 in which the currents are equal. The current mirror 20 is constituted by the transistors 126 and 127, each of which is disposed in a respective one of the current paths 123 and 124. The inverter is connected in series between the gates of the transistors of the second current mirror for the same purpose as has already been described.

In effect, both embodiments provide an infinite feedback resistor. The use of the current mirrors to provide the feedback enables very precise control of the currents and also facilitates operation at a very low level of power consumption.

Although both embodiments have been described in relation to oscillators, the active feedback circuit may be used as, for example, a level shifter by omission of the frequency selective circuit between the terminals 11 and 12. Thus the circuit may be used as a bias circuit for an inverter amplifier, to provide bias which is stable over wide ranges of process variation, supply voltage and operating temperature.

The embodiments of the invention which are described in the following are different forms of an oscillator which includes a level shifter and signal multiplier. The main object of the level shifting and signal multiplying circuit is to provide a faithful reproduction of a small oscillator signal in a magnified form and thereby for example to achieve a full rail-to-rail swing (such as 5 volts) and, preferably, a duty cycle of 50:50.

Figure 3:
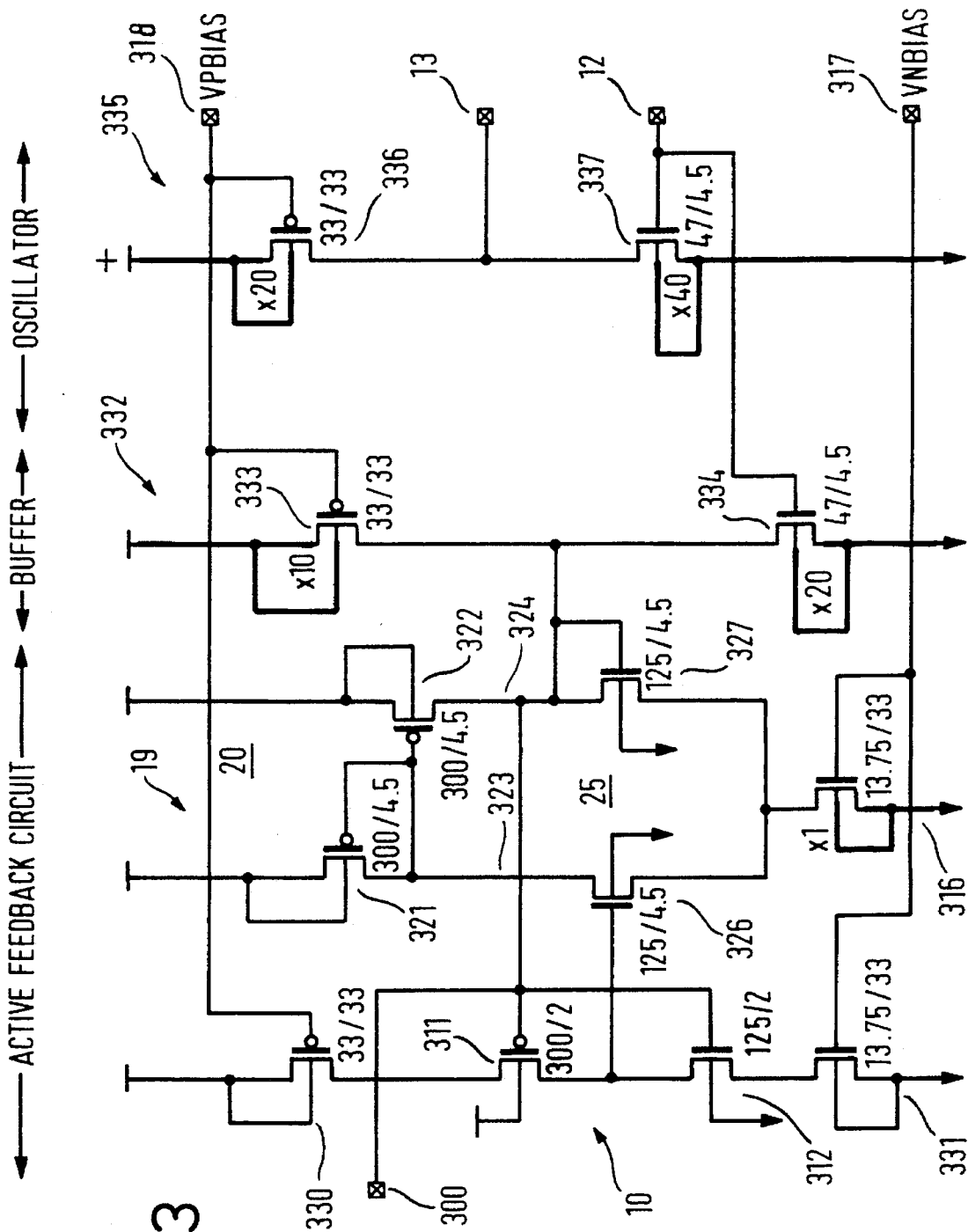
FIG. 3 illustrates another embodiment of the invention, including a level shifter.

FIG. 3 illustrates an oscillator and level shifter combination which includes an inverter 10 and a differential current mirror system 19, consisting of current mirrors 20 and 25, generally similar to those described with reference to FIG. 1. The inverter 10 and the current mirrors 19 and 25 are denoted the 'active feedback circuit' in FIG. 3.

In this embodiment, the inverter 10 is a CMOS inverter constituted by a p-channel transistor 311 and an n-channel transistor 312, the drain of transistor 311 being connected to the source of transistor 312, and the gates of these two transistors being connected together and also connected to the current path 324, corresponding to the current path 24 in FIG. 1, between the drain of the p-channel transistor 322 in the upper current mirror 20 and the drain of an n-channel transistor 327 in the lower current mirror 325. The upper current mirror 20 is completed by a p-channel transistor 321 of which the gate is connected to the gate of transistor 322 and also connected to the drain of transistor 321. The lower current mirror 25 is completed by the n-channel transistor 326 of which the gate is connected to the drains of transistors 311 and 312 in the inverter 10 and of which the drain is connected by current path 323 to the drain of transistor 321. Thus the inverter 10 has its input and output connected between the gates of the transistors 326 and 327 of the current mirror 25.

A source current for the inverter 10 is provided by a p-channel transistor 330 of which the source is connected to the positive rail and of which the gate is connected to a vp-bias line 318. A sink transistor for the inverter is provided by an n-channel transistor 331 of which the drain is connected to the source of transistor 312, the source is connected to the negative (earth) line and the gate is connected to a vn-bias line 317. Further, a current source for the mirror 25 is provided by an n-channel transistor 316 of which the drain is connected to the sources of transistors 326 and 327, the source is connected to the relatively negative (earth) line and the gate is connected to the vn-bias line 317.

As noted above, the circuits 10 and 19 in FIG. 3 constitute the inverter with its active feedback circuit; however, in this form of the invention, the inverter 10 and the current mirrors 20 and 25 act as a level shifter which shifts a bias level from Vtn, i.e. the n-channel threshold, to $V_{DD}/2$, i.e. half the supply voltage.

The level shifter is separated by a buffer circuit 332 from an inverter oscillator 335. The buffer circuit 332 comprises a p-channel transistor 333 of which the source is connected to the positive rail and the gate is connected to the vp-bias line 318. The transistor 334 is an n-channel transistor of which the gate constitutes the control input, being connected to the 'input' terminal of the oscillator. The drains of transistors 333 and 334 are connected together to the input of the inverter 10.

The oscillator stage in FIG. 3 is constituted by a CMOS inverter 335 comprising a p-channel transistor 336 and an n-channel transistor 337. The source of transistor 336 is connected to the positive rail and the source of transistor 337 is connected to the relatively negative (earth) rail and the drains of transistors 336 and 337 are connected together to the 'output' terminal 13 of the oscillator. As previously described, the 'input' and 'output' terminals 12 and 13 of the oscillator represent the two terminals of a one port frequency selective network or element such as a quartz crystal.

In the circuit shown in FIG. 3, the oscillator 335 has a slight voltage swing (such as 0.5 volts) relative to the full rail-to-rail voltage. The signal at the oscillator input terminal 12 is connected to the input of the matched buffer stage 332, the output of which is connected to the input of the inverter 10 within the current mirror system 19.

The active feedback circuit constituted by the current mirrors 20, 25 thus forces the buffer's output to $V_{DD}/2$.

With a high output resistance value for the buffer stage, only a fraction of the total current from the transistor 316 is needed to set the output voltage. The active feedback circuit employs up to a maximum of 20% of the buffer's total output current to set the bias point and there is therefore ample buffer drive current to achieve full rail-to-rail swing. The final output is available at a terminal 300 connected to the input of the inverter 10.

In the circuit of FIG. 3, the buffer 332 is constituted by an inverter which is in effect a scaled down version of the inverter in the oscillator stage 335. In the latter, the current through the p-channel transistor 336 is, typically, twenty times that through the transistor 316, and the current through the transistor 337 is twice that through the transistor 336. The buffer 332 may have a quiescent current which is a substantial fraction, typically half, of that through the oscillator stage 335. This is achieved in the embodiment shown in FIG. 3 by the provision of the transistors 333 and appropriate sizes relative to the transistors 316 and the transistors in the current mirrors.

Figure 4:
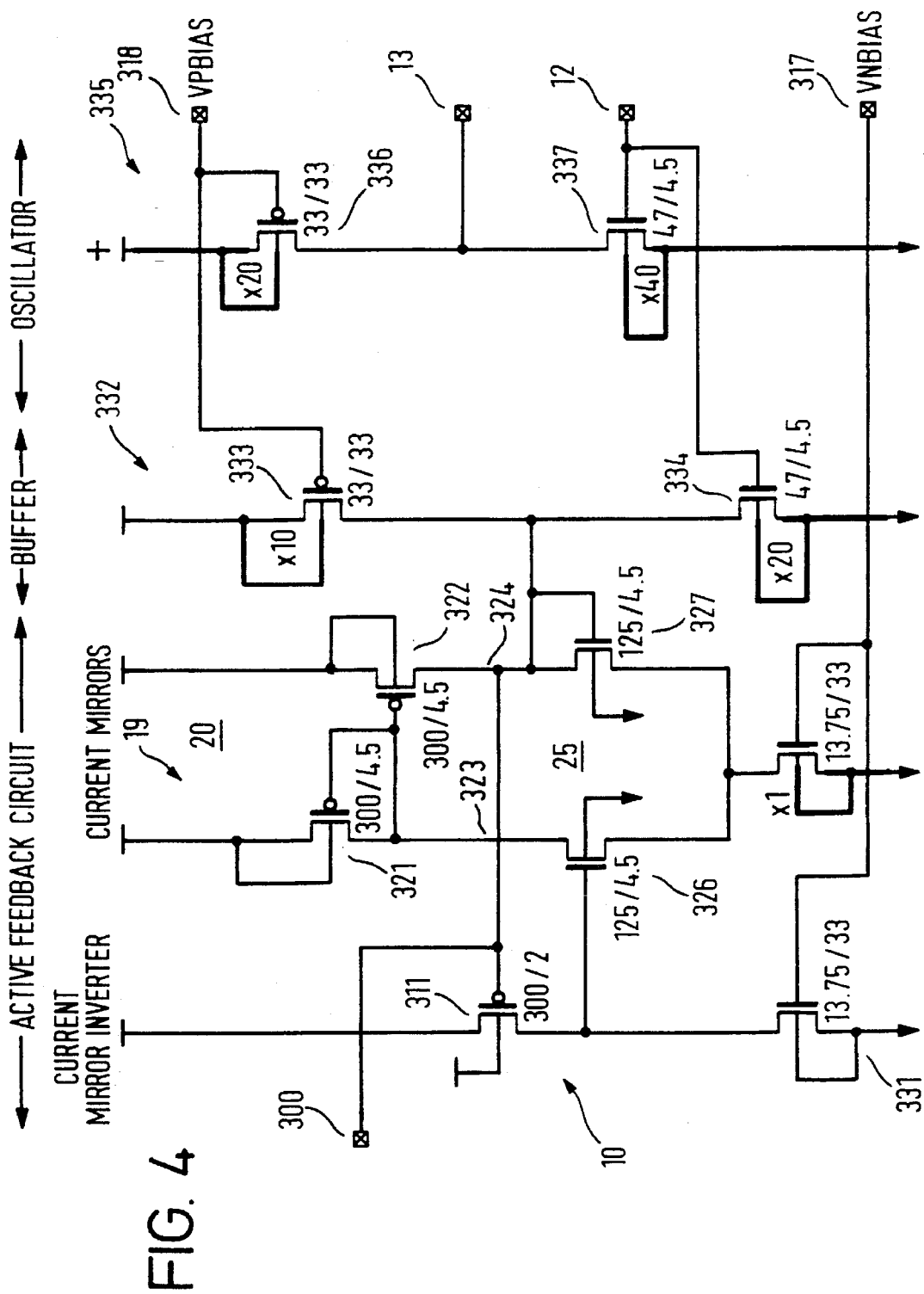
FIG. 4 illustrates a yet further embodiment of the invention including a level shifter.

FIG. 4 illustrates an alternative embodiment of the oscillator and level shifter shown in FIG. 3. This circuit achieves a shift from Vtn to Vtp. The components of the oscillator 335, the buffer 332 and the current mirrors 20 and 25 are the same as those described with reference to FIG. 3. However, in place of the CMOS inverter constituted by the transistors 311 and 312 in FIG. 3, the inverter 10 comprises merely the p-channel transistor 311 of which the drain is connected to the gate of transistor 326 in the current mirror 25 and the gate is connected to the gate of transistor 327 in the current mirror 25.

Figure 5:
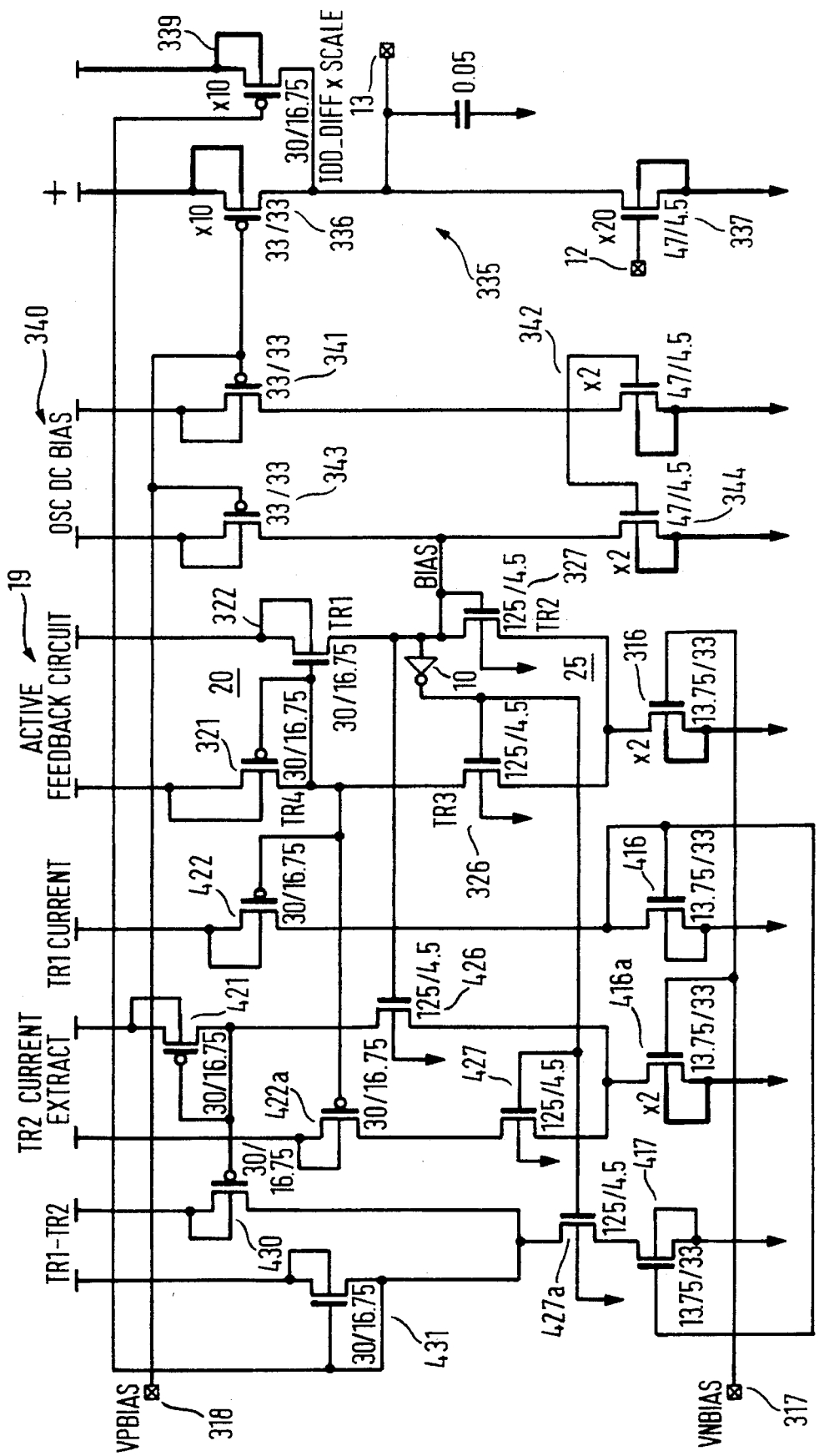
FIG. 5 illustrates another embodiment of the invention, including current-injected level shifting.

FIG. 5 illustrates a further development of the level shifter circuit preserving the principal elements of the embodiments described with reference to FIGS. 3 and 4.

In particular, the embodiment of FIG. 5 includes an inverter, shown schematically at 10, and the active feedback circuit constituted by the differential current mirror system 19 comprising the upper current mirror 20, including the transistors 321 and 322, and the lower current mirror 25 including the transistors 326 and 327 as previously described. The current mirror system includes the transistor 316 as described with reference to FIGS. 3 and 4. Further, the oscillator circuit 335 comprises the inverter constituted by the p-channel transistor 336 and the n-channel transistor 337. The 'input' terminal of the oscillator 12 is coupled to the gate of transistor 337 and the 'output' terminal 13 of the oscillator is connected to the common connection between the drains of transistors 336 and 337.

In this embodiment of the invention the inverter and level shifter is used as a reference circuit for setting the bias for a transistor 339 which is in parallel with the transistor 336 and provides level shifting by current injection into the n-channel transistor 337.

The buffer stage 332 of FIGS. 3 and 4, considered in isolation, has a dc-bias at its output equal to the dc-bias on its input. When the active feedback circuit (10 and 19) is added, the extra current needed to raise the output bias of the buffer to a new level is equal to the difference between the drain source currents of the transistors 322 and 327. This difference current is generated by the differential gate voltages of the transistors 326 and 327.

Further, if the buffer stage is a scaled down version of the actual buffer stage of the oscillator, then to raise the output level to achieve a 50:50 duty cycle the additional current which has to be injected is the difference current between the drain source currents of transistors 322 and 327 multiplied by the scale factor.

The necessary bias for the transistor 339 is obtained by the use of a circuit in which various transistors match those in the active feedback circuit.

A current corresponding to that through transistor TR1 (transistor 322) is obtained by means of p-channel transistor 422, of which the gate is connected to the gate of transistor 322 and transistor 321, transistor 422 being matched to transistor 322 and in series with a transistor 416 matched to transistor 316. Transistor 416 forms a current mirror with a transistor 417.

A current corresponding to that through transistor TR2, namely transistor 327, is obtained by means of transistors 442a, 421, 427 and 426 matched to transistors 322, 321, 327 and 326 respectively and having a source transistor 416a corresponding to transistor 316. The current extraction is obtained using two current paths similar to those of the two principal current paths in current mirrors 20 and 25; the current is mirrored to a transistor 430. Since the total current through transistors 431 and 430 is equal to that through transistors 417 and 7a, which match transistors 326 (or 327) and 316, the current through transistor 431 is the difference current required to control the bias voltage at the gate of transistor 339 and thereby the injected current.

Bias for the inverter 10 is set by a bias circuit 340 which comprises two matched branches, a first branch comprising transistors 341 and 342 and a second branch comprising transistors 343 and 344. The gates of the p-channel transistors 341, 343 and 336 are connected in common to the vp-bias line 318 and the gates of transistors 342 and 344 are connected together. The drains of transistors 343 and 344 are connected to the input of the inverter 10 to determine the bias level at that input.

It will accordingly be seen that the basic inverter and current mirror system constituted by inverter 10 and the current mirrors 20 and 22 has considerable versatility both as a basic oscillator and as a level shifter as well as a reference circuit for controlling current injected level shifting for an oscillator.

I claim:
1. An inverter amplifier comprising:
   (a) first and second transistors constituting a first current mirror;
   (b) third and fourth transistors constituting a second current mirror, said first and third transistors being connected by a first current path and said second and fourth transistors being connected by a second current path, a control node of said first transistor being connected to a control node of said second transistor and also to said first current path; and
   (c) an inverter connected between a control node of said fourth transistor and a control node of said third transistor.
2. An inverter amplifier according to claim 1 wherein said first and second transistors are matched and said third and fourth transistors are matched.
3. An inverter amplifier according to claim 1 and further comprising a frequency selective means connected between the said input and the said output of said inverter.
4. An inverter amplifier comprising:
   (a) first and second transistors, said first and second transistors being p-channel transistors having control nodes connected together and having drain nodes connected to a first current path and a second current path respectively, the control node of said first transistor being connected to said first current path;
   (b) third and fourth transistors, said third and fourth transistors being n-channel transistors having drain nodes connected respectively to said first and second current paths and also having control nodes, the control node of said fourth transistor being connected to said second current path; and
   (c) an inverter connected between the control node of said fourth transistor and the control node of said third transistor.
5. An inverter circuit according to claim 4 and further comprising a fifth transistor connected to set the total current in said first and second current paths.
6. An inverter circuit according to claim 4 wherein said inverter comprises a p-channel transistor having a control node connected to said second current path and a drain connected to said first current path.
7. An inverter circuit according to claim 4 wherein said inverter comprises a CMOS inverter comprising a p-channel transistor and an n-channel transistor having control nodes connected together and to said first current path and having drain nodes connected together and to said first current path.
8. An oscillator circuit comprising:
   (i) an inverter amplifier comprising:
   (a) first and second transistors constituting a first current mirror;
   (b) third and fourth transistors constituting a second current mirror, said first and third transistors being connected by a first current path and said second and fourth transistors being connected by a second current path, a control node of said first transistor being connected to a control node of said second transistor and also to said first current path; and
   (c) an inverter having an input and an output, the input of the inverter being connected to a control node of said fourth transistor and also to said second current path, and the output of said inverter being connected to a control node of said third transistor;

(ii) an oscillator having a signal output; and (iii) a buffer amplifier having an input coupled to receive said signal output and for coupling the same to the input of said inverter.

9. An oscillator circuit according to claim 8 wherein:

said oscillator comprises a first CMOS inverter including transistors of selected sizes; and said buffer amplifier comprises a second CMOS inverter including transistors of sizes selected to provide through said second CMOS inverter a current which is a selected fraction of the current through said first CMOS inverter.

10. An oscillator circuit comprising:

(i) an inverter amplifier comprising:
   (a) first and second transistors constituting a first current mirror;
   (b) third and fourth transistors constituting a second current mirror, said first and third transistors being connected by a first current path and said second and fourth transistors being connected by a second current path, a control node of said first transistor being connected to a control node of said second transistor and also to said first current path; and
   (c) an inverter connected between a control node of said fourth transistor and a control node of said third transistor;

(ii) an oscillator comprising a fifth transistor, a frequency selective circuit forming an oscillator loop with said fifth transistor and control means for providing a controllable current to said fifth transistor to set a bias point for the oscillator; and (iii) means including transistors matched to said first, second, third and fourth transistors for developing a control current corresponding to a difference in currents through said second and fourth transistors and for supplying said control current to said control means.

11. An oscillator circuit according to claim 10 wherein said control means comprises a first source transistor having a control noble for receiving said control current and a second source transistor in parallel with said first source transistor and having a control node for receiving a bias current.

12. An inverter amplifier comprising:

an inverter having an input and an output; and a current mirror system connected to said input and output to provide bias voltages thereto, said current mirror system forming with said inverter a closed inverting and amplifying loop responsive to any difference between said bias voltages for providing current feedback to reduce said difference to zero.

13. An inverter amplifier according to claim 12 wherein said current mirror system comprises:

first and second transistors, said first and second transistors being p-channel transistors having control nodes connected together and having drain nodes connected to a first current path and a second current path respectively, the control node of said first transistor being connected to said first current path; and third and fourth transistors, said third and fourth transistors being n-channel transistors having drain nodes connected respectively to said first and second current paths and also having control nodes, the control node of said fourth transistor being connected to said second current path, said inverter being connected between the control nodes of said third and fourth transistors.

* * * * *